(12) United States Patent
Hasegawa (10) Patent No.: US 6,571,088 B1
(45) Date of Patent: May 27, 2003

(54) AUTOMATIC FREQUENCY CONTROL CIRCUIT

(75) Inventor: Osamu Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 497 days.

(21) Appl. No.: 09/602,553

(22) Filed: Jun. 23, 2000

(30) Foreign Application Priority Data

Jun. 25, 1999 (JP) .......................................... 11-180618

(51) Int. Cl.[7] ................................................. H04B 1/18
(52) U.S. Cl. ................................ 455/182.2; 455/164.1; 455/182.1; 455/182.3; 455/192.1; 455/192.2
(58) Field of Search .............................. 455/71, 192.1, 455/192.2, 164.1, 164.2, 173.1, 182.1, 182.3; 2/257, 260; 375/344

(56) References Cited

U.S. PATENT DOCUMENTS

| | | | | |
|---|---|---|---|---|
| 3,686,574 A | * | 8/1972 | Niman ......................... | 325/421 |
| 5,440,587 A | * | 8/1995 | Ishikawa et al. ............. | 375/332 |
| 5,513,388 A | * | 4/1996 | Suganuma ................... | 455/258 |
| 5,517,678 A | * | 5/1996 | Klank et al. ............... | 455/182.2 |
| 5,579,346 A | * | 11/1996 | Kanzaki ...................... | 375/344 |
| 6,438,183 B1 | * | 8/2002 | Taura et al. ................ | 375/343 |
| 6,463,266 B1 | * | 10/2002 | Shohara .................... | 455/196.1 |

FOREIGN PATENT DOCUMENTS

| | | |
|---|---|---|
| GB | 2 308 247 | 6/1997 |
| GB | 2 314 704 A | 1/1998 |
| WO | WO 92/02991 | 2/1992 |

* cited by examiner

Primary Examiner—William Trost
Assistant Examiner—Thang Le
(74) Attorney, Agent, or Firm—Scully, Scott, Murphy & Presser (57) ABSTRACT

In an AFC ((Automatic Frequency Control) circuit, a frequency offset estimating circuit (11) produces a lock signal (102) if a calculated frequency error becomes smaller than a predetermined value. Then, a CPU (13) produces a control signal (104) to stop the operation of the frequency offset estimating circuit (11). A timing generating circuit (14) calculates a frequency error with reference to a frame timing correction amount from a delay profile/search circuit (12), and produces an unlock signal (103) if the frequency error becomes equal to or greater than the predetermined value. Then, the CPU (13) produces the control signal (104) to start the operation of the frequency offset estimating circuit (11). Thus, the frequency offset estimating circuit (11) stops its operation while the AFC operation is in the locked state.

6 Claims, 4 Drawing Sheets

AUTOMATIC FREQUENCY CONTROL CIRCUIT

BACKGROUND OF THE INVENTION

This invention relates to an AFC (Automatic Frequency Control) circuit for matching the frequency of a reference clock signal in a mobile station to the frequency of a reference clock signal in a base station as a transmitting side.

In recent years, as a communication system used in mobile communication, attention is directed to a CDMA (Code Division Multiple Access) communication system resistant against interference and disturbance. In the CDMA communication system, communication is carried out as follows. On a transmitting side, a user signal to be transmitted is spread by the use of a spread code before it is transmitted. On a receiving side, despreading is carried out by the use of a spread code identical with the above-mentioned spread code to obtain the original user signal.

In the above-mentioned CDMA communication system, it is impossible to carry out despreading on the receiving side unless phase synchronization is established between spread code sequences on the transmitting side and the receiving side. Under the circumstances, in a mobile station as the receiving side, a TCXO (Temperature Compensated Crystal Oscillator) having very high frequency accuracy is used as a reference oscillator. The reference oscillator serves to generate a reference clock signal used upon demodulating a reception signal supplied from a base station as the transmitting side. However, since the mobile station is required to be small in size and low in cost, the reference oscillator used in the mobile station is relatively low in frequency accuracy as compared with that used in the base station. In this connection, the mobile station carries out an AFC operation for matching the frequency of the reference clock signal in the mobile station to the frequency of a reference clock signal in the base station.

Figure 1:
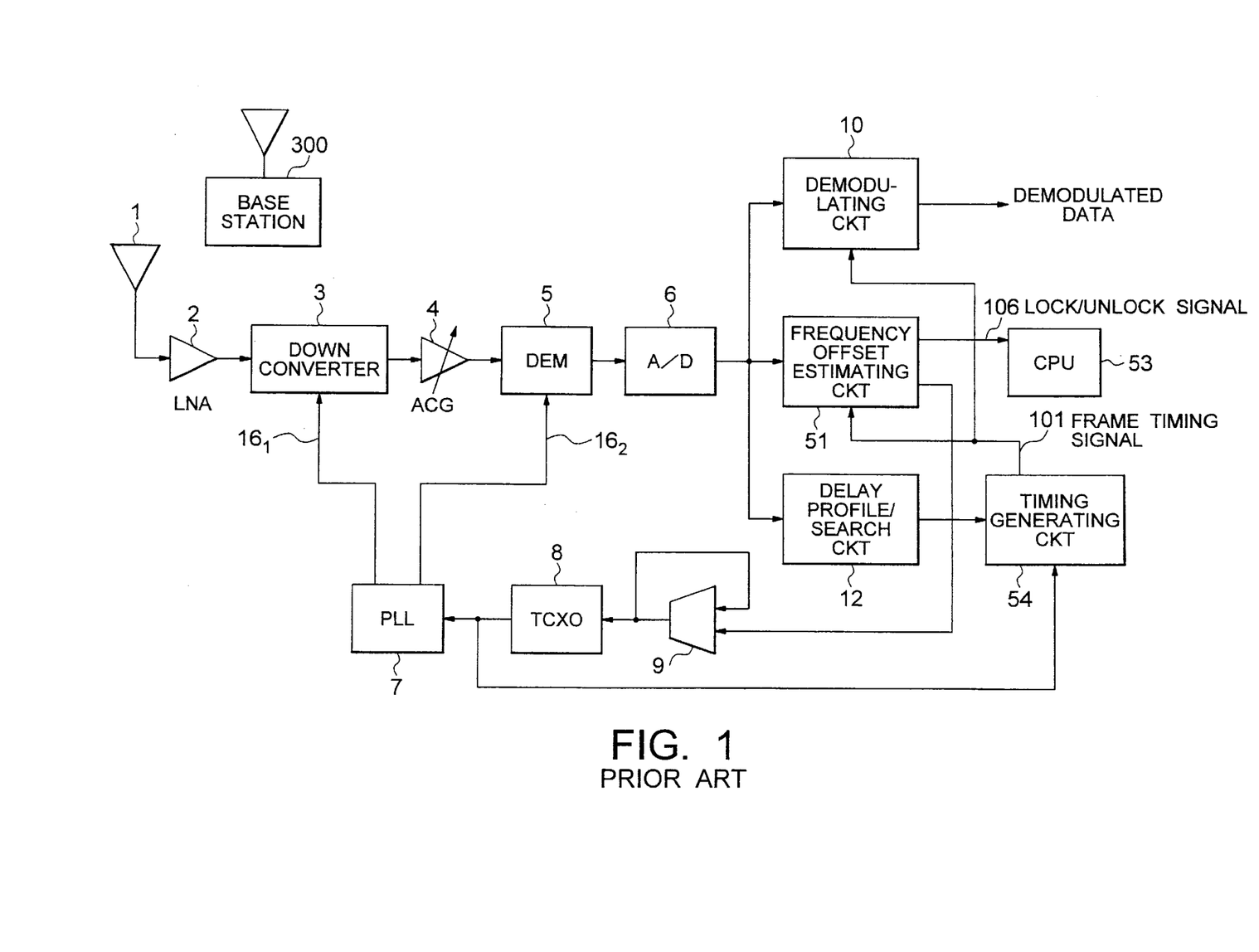
FIG. 1 is a block diagram of a conventional AFC circuit.

Referring to FIG. 1, a conventional AFC circuit for carrying out the above-mentioned AFC operation will be described. The conventional AFC circuit is formed by a heterodyne receiver and comprises an antenna 1, a low-noise amplifier (LNA) 2, a down converter 3, an AGC (Automatic Gain Control) amplifier 4, a quadrature demodulator (DEM) 5, an A/D (Analog-to-Digital) converter 6, a PLL (Phase-Locked Loop) circuit 7, a reference clock generating circuit (TCXO) 8, an accumulator 9, a demodulating circuit 10, a frequency offset estimating circuit 51, a delay profile/search circuit 12, a CPU (Central Processing Unit) 53, and a timing generating circuit 54.

The low-noise amplifier 3 amplifies a reception signal received through the antenna 1 from a base station 300. The low-noise amplifier 3 thereby produces an amplified signal. The down converter 3 is supplied with the amplified signal from the low-noise amplifier 3 and converts the amplified signal into an intermediate frequency (IF) signal by the use of a first local signal $16_1$. The AGC amplifier 4 is supplied with the IF signal from the down converter 3 and carries out gain control of the IF signal so that the A/D converter 6 has a constant input level. The AGC amplifier 4 delivers a gain-controlled IF signal to the quadrature demodulator 5.

Supplied with the gain-controlled IF signal, the quadrature demodulator 5 carries out quadrature demodulation by the use of a second local signal $16_2$ to convert the gain-controlled IF signal into an analog baseband signal. Supplied with the analog baseband signal from the quadrature demodulator 5, the A/D converter 6 converts the analog baseband signal into a digital baseband signal.

The PLL circuit 7 is responsive to a reference clock signal generated by the TCXO 8 and produces the first local signal $16_1$ to be supplied to the down converter 3 and the second local signal $16_2$ to be supplied to the quadrature demodulator 5. The TCXO 8 produces the reference clock signal having an oscillation frequency controlled by a control voltage produced by the accumulator 9.

Figure 2:
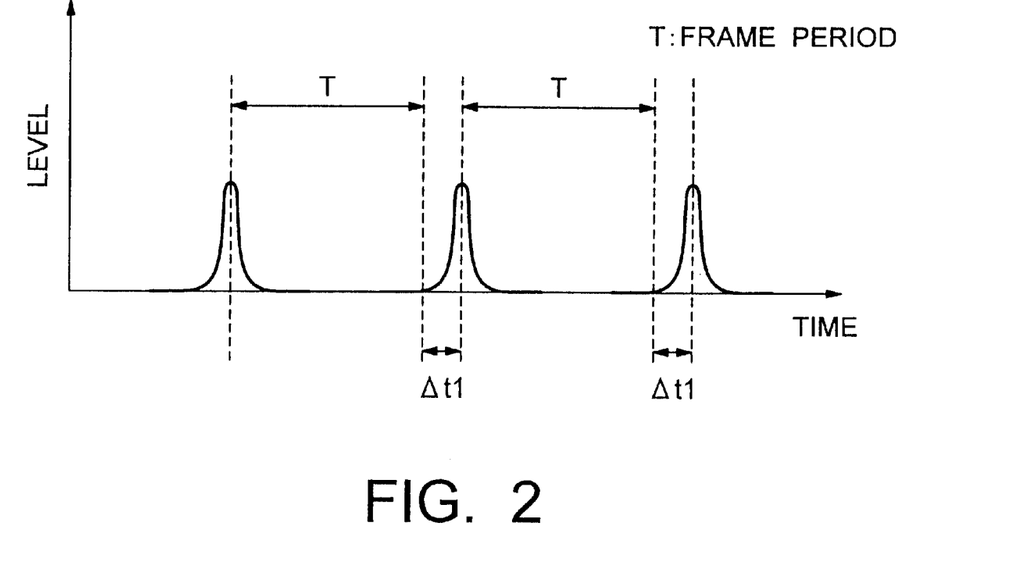
FIG. 2 is a view showing profile data and a frame timing correction amount calculated by a delay profile/search circuit illustrated in FIG. 1.

The delay profile/search circuit 12 is supplied with the digital baseband signal from the A/D converter 6 and produces profile data and a frame timing correction amount ($\Delta t1$). The profile data and the frame timing correction amount ($\Delta t1$) produced by the delay profile/search circuit 12 are shown in FIG. 2. The profile data represents a profile of data including in the digital baseband signal. It is noted here that the frame timing correction amount ($\Delta t1$) is a discrete value because it is derived from a sampling rate of the A/D converter 6.

The timing generating circuit 54 produces an ideal frame timing with reference to the reference clock signal from the TCXO 8 and adds to the ideal frame timing the frame timing correction amount ($\Delta t1$) produced by the delay profile/search circuit 12 to produce a frame timing signal 101 representative of the result of addition.

The demodulating circuit 10 comprises a RAKE receiver including a plurality of finger receivers and demodulates, with reference to the frame timing signal 101, the digital baseband signal produced by the A/D converter 6.

With reference to the frame timing signal 101, the frequency offset estimating circuit 51 calculates the frequency error contained in the digital baseband signal from the A/D converter 6. When the frequency error thus calculated becomes equal to or smaller than a predetermined value, the frequency offset estimating circuit 51 judges that the AFC operation is put in a locked state. When the frequency error becomes greater than the predetermined value, the frequency offset estimating circuit 51 judges that the AFC operation is put in an unlocked state. The frequency offset estimating circuit 51 informs the result of judgment to the CPU 53 by the use of a lock/unlock signal 106.

Figure 3:
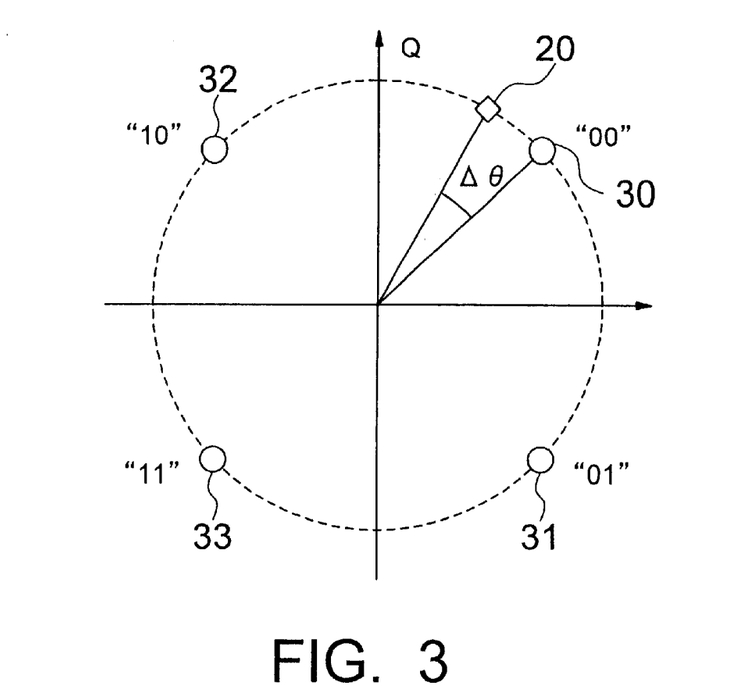
FIG. 3 is a view for describing calculation of a frequency error in a frequency offset estimating circuit illustrated in FIG. 1.

Referring to FIG. 3, description will be made of calculation of the frequency error in the frequency offset estimating circuit 51. The frequency error is calculated by the use of a symbol, such as a pilot symbol, having a symbol pattern which is preliminarily known on a receiver side. In FIG. 3, ideal symbol points 30 through 33 show symbols "00", "01", "10", and "11" on an IQ plane in case where no frequency error is contained, respectively.

By way of example, consideration will be made about a signal modulated at 16 ksps by QPSK modulation. It is assumed that a pilot symbol at a particular timing has a symbol pattern "00" and that demodulation is carried out at a symbol point 20 obtained by rotation of $\Delta\theta=10°$ on the IQ plane as illustrated in FIG. 3. In this event, the frequency error is calculated by:

$$16k \times 10°/360° = 44 \text{ Hz}.$$

Therefore, by feeding back the frequency error through the accumulator 9 to the TCXO 8, the AFC operation is put in the locked state, i.e., $\Delta\theta \div 0°$. Then, the frequency offset estimating circuit 51 produces a lock/unlock signal 106 representative of the locked state and delivers the lock/unlock signal 106 to the CPU 53.

Supplied with the lock/unlock signal 106, the CPU 53 knows the current state of the AFC operation.

The accumulator 9 produces a control voltage and adds to a current value of the control voltage the frequency error calculated by the frequency offset estimating circuit 51.

Referring to FIGS. 1 through 3, the operation of the conventional AFC circuit mentioned above will be described.

The reception signal received through the antenna 1 is amplified by the low-noise amplifier 2 and then converted by the down converter 3 into the IF signal by the use of the first local signal 16, produced by the PLL circuit 7. The IF signal is supplied to the AGC amplifier 4 to be gain-controlled so that the A/D converter 6 has a constant input level. The gain-controlled IF signal is supplied to the quadrature demodulator 5 to be quadrature-demodulated into the analog baseband signal by the use of the second local signal 162 produced by the PLL circuit 7. The analog baseband signal is supplied to the A/D converter 6 to be converted into the digital baseband signal. The digital baseband signal is supplied to the demodulating circuit 10, the frequency offset estimating circuit 51, and the delay profile/search circuit 12. Supplied with the digital baseband signal, the delay profile/search circuit 12 produces the profile data and the frame timing correction amount ($\Delta t1$).

The timing generating circuit 54 generates the ideal frame timing with reference to the reference clock signal from the TCXO 8. The timing generating circuit 54 adds to the ideal frame timing the frame timing correction amount ($\Delta t1$) produced by the delay profile/search circuit 12 to produce the frame timing signal 101 representative of the result of addition.

The frame timing signal 101 is supplied to the frequency offset estimating circuit 51 and the demodulating circuit 10. Supplied with the frame timing signal 101, the demodulating circuit 10 demodulates the digital baseband signal produced by the A/D converter 6.

Supplied with the frame timing signal 101, the frequency offset estimating circuit 51 calculates the frequency error contained in the digital baseband signal from the A/D converter 6.

The accumulator 9 produces the control voltage and adds to the current value of the control voltage the frequency error calculated by the frequency offset estimating circuit 51. The control voltage produced by the accumulator 9 is supplied to the TCXO 8 to control the frequency of the reference clock signal produced therefrom. Thus, feedback is carried out.

When the frequency error thus calculated becomes smaller than the predetermined value, the frequency offset estimating circuit 51 judges that the AFC operation is put in the locked state. When the frequency error becomes equal to or greater than the predetermined value, the frequency offset estimating circuit 51 judges that the AFC operation is put in the unlocked state. The result of judgment is informed to the CPU 53 by the use of the lock/unlock signal 106. Thus, the CPU 53 knows the current state of the AFC operation.

In the conventional AFC circuit described above, the frequency offset estimating circuit 51 calculates the frequency error, carries out frequency pulling operation in the AFC operation with reference to the frequency error thus calculated, and detects the locked and the unlocked states of the AFC operation by the use of the frequency error. Therefore, even if the AFC operation is in the locked state, the frequency offset estimating circuit 51 must continuously be operated in order to detect the unlocked state. This results in unnecessary power consumption.

The conventional AFC circuit mentioned above is disadvantageous in that unnecessary power consumption is inevitable because the frequency offset estimating circuit must continuously be operated to detect the unlocked state even if the AFC operation is in the locked state.

SUMMARY OF THE INVENTION

It is an object of this invention to provide an AFC circuit capable of reducing power consumption by stopping the operation of a frequency offset estimating circuit if an AFC operation is in a locked state.

It is another object of this invention to provide an AFC circuit capable of reducing power consumption by omitting the frequency offset estimating circuit.

According to an aspect of this invention, there is provided An AFC circuit for use in a receiver in matching the frequency of a reference clock signal in the receiver with the frequency of a reference clock signal in a transmitter, the circuit comprising:

an orthogonal demodulator supplied with a reception signal received from the transmitter for carrying out orthogonal demodulation by the use of a local signal to convert the reception signal into an analog baseband signal;

an A/D converter supplied with the analog baseband signal produced by the orthogonal demodulator for carrying out A/D conversion to produce a digital baseband signal;

a delay profile/search circuit responsive to the digital baseband signal produced by the A/D converter for producing profile data represents profile of data of the digital baseband signal and a frame timing correction amount, the profile data representing a profile of data including in the digital baseband signal;

a timing generating circuit for generating an ideal frame timing on the basis of the reference clock signal in the receiver and for adding the frame timing correction amount to the ideal frame timing to produce a frame timing signal, the timing generating circuit being furthermore for calculating, with reference to the frame timing correction amount, a first frequency error representative of a difference in frequency between the reference clock signal in the receiver and the reference clock signal in the transmitter and for judging that an AFC operation is put into an unlocked state to produce an unlock signal if an absolute value of the first frequency error becomes equal to or greater than a first predetermined value;

a frequency offset estimating circuit for calculating, with reference to the frame timing signal, a second frequency error representative of a difference in frequency between the reference clock signal in the receiver and that reference clock signal in the transmitter which is contained in the digital baseband signal from the A/D converter, the frequency offset estimating circuit being furthermore for judging that the AFC operation is put into a locked state to produce a lock signal if an absolute value of the second frequency error becomes equal to or smaller than a second predetermined value not greater than the first predetermined value, the frequency offset estimating circuit being turned off and on under control of a control signal;

a CPU for controlling the frequency offset estimating circuit by the use of the control signal so that the frequency offset estimating circuit is turned off when the CPU is supplied with the lock signal and that the frequency offset estimating circuit is turned on when the CPU is supplied with the unlock signal;

an accumulator which produces a control voltage and which is for adding to a current value of the control voltage the frequency error calculated by the frequency offset estimating circuit to produce a new value of the control voltage;

a reference clock generating circuit for generating, as the reference clock signal in the receiver, a controlled reference clock signal having an oscillation frequency controlled by the new value of the control voltage; and a PLL circuit for producing the local signal on the basis-of the controlled reference clock signal.

In the AFC circuit according to this invention, the frequency offset estimating circuit detects the locked state of the AFC operation when the detected frequency error is substantially equal to 0. In this event, the CPU produces the control signal to make the frequency offset estimating circuit stop its operation. The timing generating circuit is responsive to the frame timing correction amount from the delay profile/search circuit and calculates the frequency error. If the frequency error becomes equal to or greater than the predetermined value, the timing generating circuit produces the unlock signal. Then, the CPU produces the control signal to make the frequency offset estimating circuit start its operation. Thus, the AFC operation is carried out.

Therefore, it is unnecessary to continuously keep the frequency offset estimating circuit in operation in order to detect the unlocked state of the AFC operation and to carry out the AFC operation. The operation of the frequency offset estimating circuit can be stopped during the locked state of the AFC operation. Therefore, power consumption can be reduced.

According to another aspect of this invention, there is provided an AFC circuit for use in a receiver in matching the frequency of a reference clock signal in the receiver with the frequency of a reference clock signal in a transmitter, the circuit comprising:

an orthogonal demodulator supplied with a reception signal received from the transmitter for carrying out orthogonal demodulation by the use of a local signal to convert the reception signal into an analog baseband signal;

an A/D converter supplied with the analog baseband signal produced by the orthogonal demodulator for carrying out A/D conversion to produce a digital baseband signal;

a delay profile/search circuit responsive to the digital baseband signal produced by the A/D converter for producing profile data represents profile of data of the digital baseband signal and a frame timing correction amount, the profile data representing a profile of data including in the digital baseband signal;

a timing generating circuit for generating an ideal frame timing on the basis of the reference clock signal in the receiver and for adding the frame timing correction amount to the ideal frame timing to produce a frame timing signal for use in demodulating the digital baseband signal, the timing generating circuit being furthermore for calculating, with reference to the frame timing correction amount, a frequency error representative of a difference in frequency between the reference clock signal in the receiver and the reference clock signal in the transmitter and for judging that an AFC operation is put into an unlocked state to produce an unlock signal if an absolute value of the frequency error becomes equal to or greater than a predetermined value, the timing generating circuit judging that the AFC operation is put into a locked state to produce a lock signal if the frequency error becomes smaller than the predetermined value;

a logical table memorizing section which memorizes a table of the frequency error based on the frame timing correction amount and which is supplied with a particular frame timing correction amount calculated by the delay profile/search circuit for calculating a particular frequency error corresponding to the particular frame timing correction amount supplied thereto;

an accumulator which produces a control voltage and which is for adding to a current value of the control voltage the frequency error calculated by the logical table memorizing section to produce a new value of the control voltage;

a reference clock generating circuit for generating, as the reference clock signal in the receiver, a controlled reference clock signal having an oscillation frequency controlled by the new value of the control voltage; and a PLL circuit for producing the local signal on the basis of the controlled reference clock signal.

In this invention, the frequency offset estimating circuit can be omitted by providing the logical table memorizing section which memorizes the table of the frequency error based on the frame timing correction amount. Thus, power consumption can be reduced not only during the stop of the AFC operation but also during execution of the AFC operation.

DESCRIPTION OF THE PREFERRED EMBODIMENTS

Now, description will be made in detail about embodiments of this invention with reference to the drawing.

(1st Embodiment)

Figure 4:
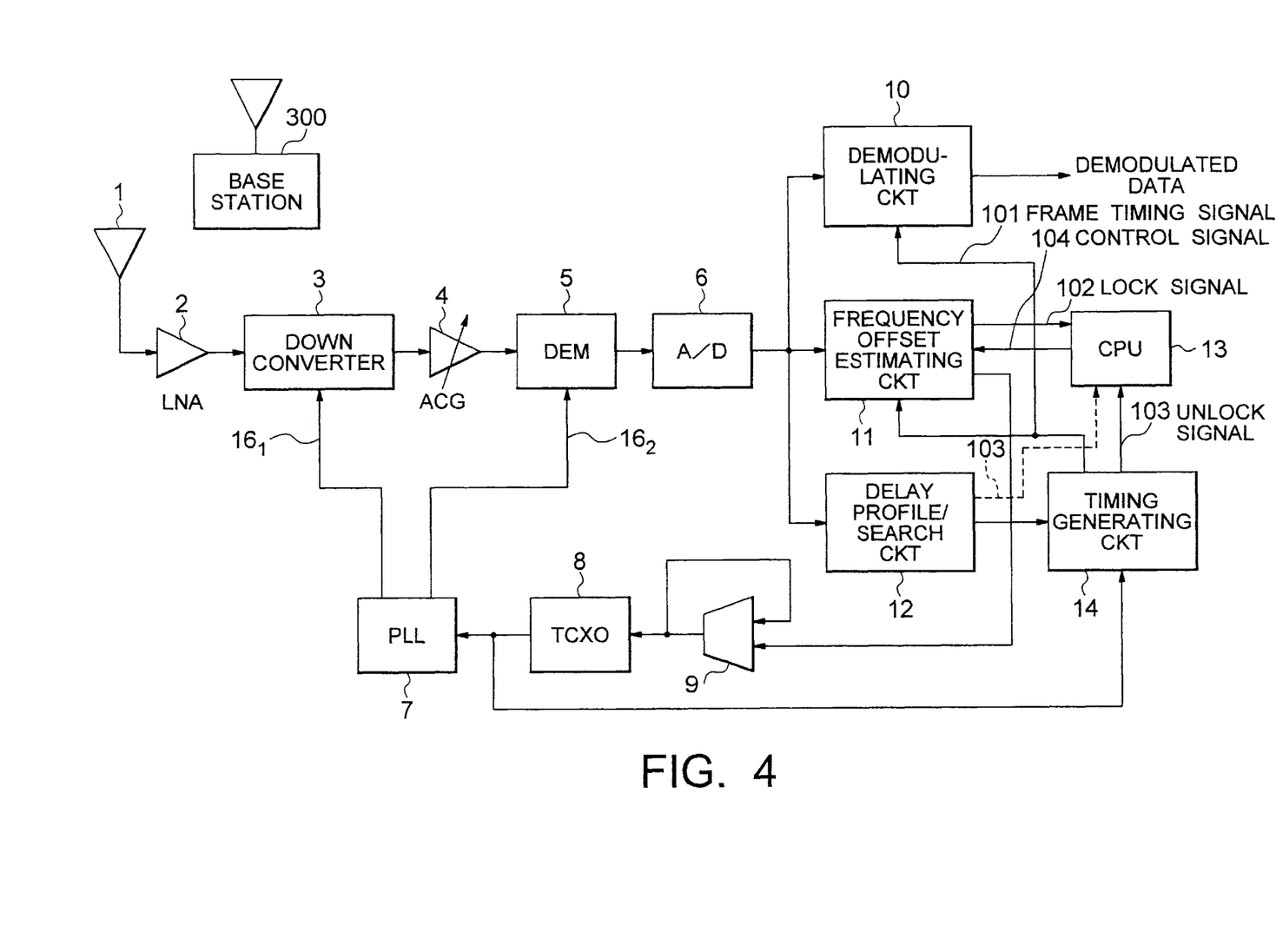
FIG. 4 is a block diagram of an AFC circuit according to a first embodiment of this invention.

Referring to FIG. 4, description will be made about an AFC circuit according to a first embodiment of this invention.

As illustrated in FIG. 4, the AFC circuit comprises an antenna 1, a low-noise amplifier (LNA) 2, a down converter 3, an AGC (Automatic Gain Control) amplifier 4, a quadrature demodulator (DEM) 5, an A/D (Analog-to-Digital) converter 6, a PLL (Phase-Locked Loop) circuit 7, a reference clock generating circuit (TCXO) 8, an accumulator 9, a demodulating circuit 10, a frequency offset estimating circuit 11, a delay profile/search circuit 12, a CPU (Central Processing Unit) 13, and a timing generating circuit 14. Thus, the AFC circuit in this embodiment is similar to the conventional AFC circuit illustrated in FIG. 1 except that the frequency offset estimating circuit 51, the CPU 53, the timing generating circuit 54 are replaced by the frequency offset estimating circuit 11, the CPU 13, and the timing generating circuit 14, respectively.

Like the frequency offset estimating circuit 51 in the conventional AFC circuit in FIG. 1, the frequency offset estimating circuit 11 calculates, with reference to a frame timing signal 101, the frequency error contained in a digital baseband signal from the A/D converter 6. If the frequency error thus calculated becomes smaller than a predetermined value, the frequency offset estimating circuit 11 judges that the AFC operation is put in a locked state, and produces a lock signal 102 which is sent to the CPU 13. Furthermore, the frequency offset estimating circuit 11 is controlled by a control signal 104 from the CPU 13 to be tuned off or on. The frequency offset estimating circuit 11 stops its operation when it is turned off by the control signal 104.

In addition to the function of the timing generating circuit 54 illustrated in FIG. 1, the timing generating circuit 14 calculates the frequency error with reference to a frame timing correction amount (Δt1) calculated by the delay profile/search circuit 12. If the frequency error becomes equal to or greater than the predetermined value, the timing generating circuit 14 judges that the AFC operation is put in an unlocked state, and produces an unlock signal 103. Calculation of the frequency error in the timing generating circuit 14 will hereinafter be described in detail.

After the AFC operation is put in the locked state, the delay profile/search circuit 12 continuously calculates the frame timing correction amount (Δt1), which is a difference from the frame timing signal, in order to correct the frame timing signal 101 at every sampling clock. The timing generating circuit 14 is responsive to the frame timing correction amount (Δt1) and calculates the frequency error (in terms of ppm). For example, it is assumed that the frame period is equal to 10 ms and the time difference is equal to 10 ns. In this event, the frequency error is calculated as: 10 ns/10 ms=1 ppm. If the frequency error becomes equal to or greater than the predetermined value, the timing generating circuit 14 produces the unlock signal 103 which is delivered to the CPU 13.

Supplied with the lock signal 102 from the frequency offset estimating circuit 11, the CPU 13 controllably turn off the frequency offset estimating circuit 11 by the use of the control signal 104. Supplied with the unlock signal 103 from the timing generating circuit 14, the CPU 13 controllably turn on the frequency offset estimating circuit 11 by the use of the control signal 104.

Next, the operation of the AFC circuit in this embodiment will be described in detail with reference to FIG. 4.

The operation from the reception of a reception signal through the antenna 1 to the production of the digital baseband signal by the A/D converter 6 is similar to that of the conventional AFC circuit illustrated in FIG. 1 and will not be described any longer.

The digital baseband signal produced by the A/D converter 6 is supplied to the demodulating circuit 10, the frequency offset estimating circuit 11, and the delay profile/search circuit 12. The delay profile/search circuit 12 produces profile data and the frame timing correction amount (Δt1). The timing generating circuit 14 produces the frame timing signal 101 by the use of the frame timing correction amount (Δt1) produced by the delay profile/search circuit 12. The frame timing signal 101 is supplied to the frequency offset estimating circuit 11 and the demodulating circuit 10.

With reference to the frame timing signal 101, the frequency offset estimating circuit 11 calculates the frequency error contained in the digital baseband signal from the A/D converter 6. The frequency error is delivered to the accumulator 9 so that a control voltage produced by the accumulator 9 is modified and that the frequency of the reference clock signal produced by the TCXO 8 is modified. Thus, the frequency of the reference clock signal on the receiving side becomes substantially equal to the frequency of the reference clock signal on the transmitting side so that the frequency error is substantially equal to 0.

When the frequency error becomes substantially equal to 0 after carrying out the AFC operation, the frequency offset estimating circuit 11 judges that the AFC operation is put in the locked state, and delivers the lock signal 102 to the CPU 13. Supplied with the lock signal 102, the CPU 13 knows that the AFC operation is put into the locked state, and turns off the frequency offset estimating circuit 11 by the use of the control signal 104.

During the locked state of the AFC operation, the delay profile/search circuit 12 continuously calculates the frame timing correction amount (Δt1). The timing generating circuit 14 continuously calculates the frequency error with reference to the frame timing correction amount (Δt1) calculated by the delay profile/search circuit 12. If the frequency error becomes equal to or greater than the predetermined value, the timing generating circuit judges that the AFC operation is put in the unlocked state, and produces the unlock signal 103. It is noted here that the reception signal is under the influence of fading. In view of the above, the timing generating circuit 14 may take an average of the frequency error over several frames to thereby prevent operation error.

Supplied with the unlock signal 103, the CPU 13 turns off the frequency offset estimating circuit 11 by the use of the control signal 104. This triggers the frequency pulling operation. Thereafter, the locked and the unlocked states are repeated by the above-mentioned operation.

In the above-mentioned AFC circuit of this embodiment, the frequency offset estimating circuit 11 stops its operation during the locked state of the AFC operation. Therefore, as compared with the conventional AFC circuit, power consumption can be reduced.

In this embodiment, judgment of the unlocked state of the AFC operation is made by the timing generating circuit 14. Alternatively, the delay profile/search circuit 12 may carry out judgment of the unlocked state of the AFC operation so that the unlock signal 103 is produced by the delay profile/search circuit 12 and is directly delivered from the delay profile/search circuit 12 to the CPU 13 as shown by a broken line in FIG. 4.

(2nd Embodiment)

Now, description will be made about an AFC circuit according to a second embodiment of this invention.

Figure 5:
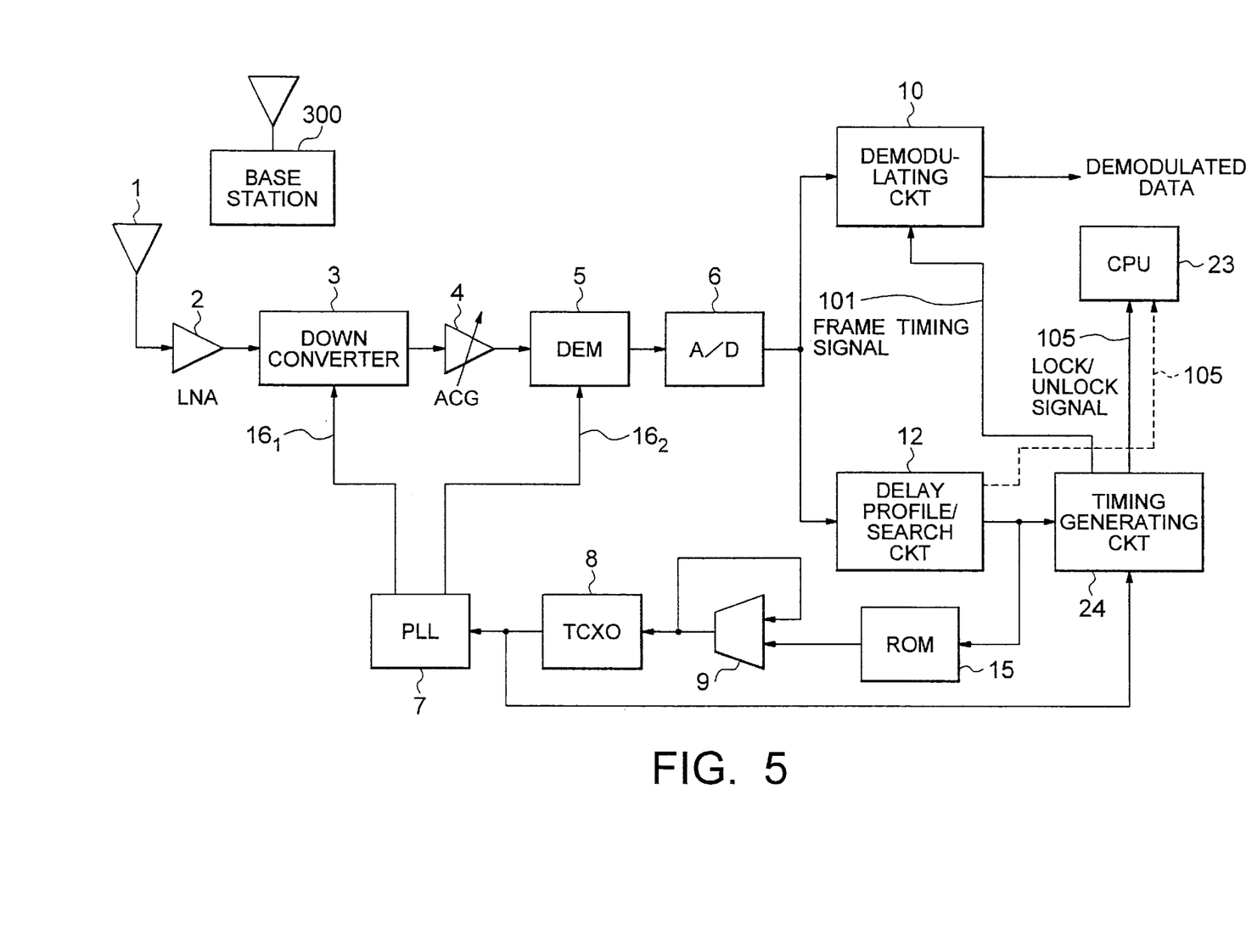
FIG. 5 is a block diagram of an AFC circuit according to a second embodiment of this invention.

The AFC circuit in this embodiment is similar to the AFC circuit in the first embodiment illustrated in FIG. 4 except that the frequency offset estimating circuit 11 is deleted, a ROM 15 is newly added, and the timing generating circuit 14 and the CPU 13 are replaced by a timing generating circuit 24 and a CPU 23, respectively.

In addition to the function of the timing generating circuit 54 illustrated in FIG. 1, the timing generating circuit 24 calculates the frequency error with reference to the frame timing correction amount (Δt1) calculated by the delay profile/search circuit 12. If the frequency error becomes equal to or greater than the predetermined value, the timing generating circuit judges that the AFC operation is put in the unlocked state. If the frequency error becomes smaller than the predetermined value, the timing generating circuit judges that the AFC operation is put in the locked state. The result of judgment is sent to the CPU 23 as a lock/unlock signal 105.

The ROM 15 serves as a logical table memorizing section which memorizes a table of the frequency error based on the frame timing correction amount (Δt1) calculated by the delay profile/search circuit 12. Supplied with the frame timing correction amount (Δt1) produced by the delay profile/search circuit 12, the ROM delivers to the accumulator 9 the frequency error corresponding to the frame timing correction amount (Δt1). Thus, the AFC operation is carried out without using the frequency error information from the frequency offset estimating circuit 11.

Supplied with the lock/unlock signal 105, the CPU 23 knows the current state of the AFC operation.

It is noted here that the accuracy of the AFC operation in the AFC circuit of this embodiment depends upon the sampling frequency of the A/D conversion carried out by the A/D converter 6. Therefore, this embodiment can be applied only when the AFC circuit is not required to have so high accuracy.

Since the frequency offset estimating circuit 11 is unnecessary, the AFC circuit in this embodiment has an additional advantage that the power consumption can be reduced also during execution of the AFC operation.

In this embodiment, judgment of the locked and the unlocked states of the AFC operation is made by the timing generating circuit 24. Alternatively, judgment of the locked and the unlocked states of the AFC operation may be carried out by the delay profile/search circuit 12 so that the lock/unlock signal 105 is produced by the delay profile/search circuit 12 and is directly delivered from the delay profile/search circuit 12 to the CPU 13 as shown by a broken line in FIG. 5.

As described above, in this invention, the delay profile/search circuit detects the unlocked state with reference to the frame timing correction amount. Therefore, the frequency offset estimating circuit need not be operated until the AFC operation is returned to the unlocked state after it is locked. Therefore, power consumption can be reduced during the locked state of the AFC operation.

What is claimed is:

1. An AFC circuit for use in a receiver in matching the frequency of a reference clock signal in said receiver with the frequency of a reference clock signal in a transmitter, said circuit comprising:

an orthogonal demodulator supplied with a reception signal received from said transmitter for carrying out orthogonal demodulation by the use of a local signal to convert said reception signal into an analog baseband signal;

an A/D converter supplied with said analog baseband signal produced by said orthogonal demodulator for carrying out A/D conversion to produce a digital baseband signal;

a delay profile/search circuit responsive to said digital baseband signal produced by said A/D converter for producing profile data represents profile of data of the digital baseband signal and a frame timing correction amount, said profile data representing a profile of data including in the digital baseband signal;

a timing generating circuit for generating an ideal frame timing on the basis of the reference clock signal in said receiver and for adding said frame timing correction amount to said ideal frame timing to produce a frame timing signal, said timing generating circuit being furthermore for calculating, with reference to said frame timing correction amount, a first frequency error representative of a difference in frequency between the reference clock signal in said receiver and the reference clock signal in said transmitter and for judging that an AFC operation is put into an unlocked state to produce an unlock signal if an absolute value of said first frequency error becomes equal to or greater than a first predetermined value;

a frequency offset estimating circuit for calculating, with reference to said frame timing signal, a second frequency error representative of a difference in frequency between the reference clock signal in said receiver and that reference clock signal in said transmitter which is contained in said digital baseband signal from said A/D converter, said frequency offset estimating circuit being furthermore for judging that the AFC operation is put into a locked state to produce a lock signal if an absolute value of said second frequency error becomes equal to or smaller than a second predetermined value not greater than said first predetermined value, said frequency offset estimating circuit being turned off and on under control of a control signal;

a CPU for controlling said frequency offset estimating circuit by the use of said control signal so that said frequency offset estimating circuit is turned off when said CPU is supplied with said lock signal and that said frequency offset estimating circuit is turned on when said CPU is supplied with said unlock signal;

an accumulator which produces a control voltage and which is for adding to a current value of the control voltage the frequency error calculated by said frequency offset estimating circuit to produce a new value of the control voltage;

a reference clock generating circuit for generating, as the reference clock signal in said receiver, a controlled reference clock signal having an oscillation frequency controlled by said new value of the control voltage; and a PLL circuit for producing said local signal on the basis of said controlled reference clock signal.

2. An AFC circuit as claimed in claim 1, wherein said frequency offset estimating circuit calculates, with reference to said frame timing signal, said second frequency error by the use of a pilot symbol contained in said digital baseband signal.

3. An AFC circuit for use in a receiver in matching the frequency of a reference clock signal in said receiver with the frequency of a reference clock signal in a transmitter, said circuit comprising:

an orthogonal demodulator supplied with a reception signal received from said transmitter for carrying out orthogonal demodulation by the use of a local signal to convert said reception signal into an analog baseband signal;

an A/D converter supplied with said analog baseband signal produced by said orthogonal demodulator for carrying out A/D conversion to produce a digital baseband signal;

a delay profile/search circuit responsive to said digital baseband signal produced by said A/D converter for producing profile data represents profile of data of the digital baseband signal and a frame timing correction amount, said profile data representing a profile of data including in the digital base band signal, said delay profile/search circuit being furthermore for calculating, with reference to said frame timing correction amount, a first frequency error representative of a difference in frequency between the reference clock signal in said receiver and the reference clock signal in said transmitter and for judging that an AFC operation is put into an unlocked state to produce an unlock signal if an absolute value of said first frequency error becomes equal to or greater than a first predetermined value;

a timing generating circuit for generating an ideal frame timing on the basis of the reference clock signal in said receiver and for adding said frame timing correction amount to said ideal frame timing to produce a frame timing signal;

a frequency offset estimating circuit for calculating, with reference to said frame timing signal, a second frequency error representative of a difference in frequency between the reference clock signal in said receiver and that reference clock signal in said transmitter which is contained in said digital baseband signal from said A/D converter, said frequency offset estimating circuit being furthermore for judging that the AFC operation is put into a locked state to produce a lock signal if an absolute value of said second frequency error becomes equal to or smaller than a second predetermined value not greater than said first predetermined value, said frequency offset estimating circuit being turned off and on under control of a control signal;

a CPU for controlling said frequency offset estimating circuit by the use of said control signal so that said frequency offset estimating circuit is turned off when said CPU is supplied with said lock signal and that said frequency offset estimating circuit is turned on when said CPU is supplied with said unlock signal;

an accumulator which produces a control voltage and which is for adding to a current value of the control voltage the frequency error calculated by said frequency offset estimating circuit to produce a new value of the control voltage;

a reference clock generating circuit for generating, as the reference clock signal in said receiver, a controlled reference clock signal having an oscillation frequency controlled by said new value of the control voltage; and a PLL circuit for producing said local signal on the basis of said controlled reference clock signal.

4. An AFC circuit as claimed in claim 3, wherein said frequency offset estimating circuit calculates, with reference to said frame timing signal, said second frequency error by the use of a pilot symbol contained in said digital baseband signal.

5. An AFC circuit for use in a receiver in matching the frequency of a reference clock signal in said receiver with the frequency of a reference clock signal in a transmitter, said circuit comprising:

an orthogonal demodulator supplied with a reception signal received from said transmitter for carrying out orthogonal demodulation by the use of a local signal to convert said reception signal into an analog baseband signal;

an A/D converter supplied with said analog baseband signal produced by said orthogonal demodulator for carrying out A/D conversion to produce a digital baseband signal;

a delay profile/search circuit responsive to said digital baseband signal produced by said A/D converter for producing profile data represents profile of data of the digital baseband signal and a frame timing correction amount, said profile data representing a profile of data including in the digital baseband signal;

a timing generating circuit for generating an ideal frame timing on the basis of the reference clock signal in said receiver and for adding said frame timing correction amount to said ideal frame timing to produce a frame timing signal for use in demodulating said digital baseband signal, said timing generating circuit being furthermore for calculating, with reference to said frame timing correction amount, a frequency error representative of a difference in frequency between the reference clock signal in said receiver and the reference clock signal in said transmitter and for judging that an AFC operation is put into an unlocked state to produce an unlock signal if an absolute value of said frequency error becomes equal to or greater than a predetermined value, said timing generating circuit judging that the AFC operation is put into a locked state to produce a lock signal if said frequency error becomes smaller than said predetermined value;

a logical table memorizing section which memorizes a table of the frequency error based on said frame timing correction amount and which is supplied with a particular frame timing correction amount calculated by said delay profile/search circuit for calculating a particular frequency error corresponding to said particular frame timing correction amount supplied thereto;

an accumulator which produces a control voltage and which is for adding to a current value of the control voltage the frequency error calculated by said logical table memorizing section to produce a new value of the control voltage;

a reference clock generating circuit for generating, as the reference clock signal in said receiver, a controlled reference clock signal having an oscillation frequency controlled by said new value of the control voltage; and a PLL circuit for producing said local signal on the basis of said controlled reference clock signal.

6. An AFC circuit for use in a receiver in matching the frequency of a reference clock signal in said receiver with the frequency of a reference clock signal in a transmitter, said circuit comprising:

an orthogonal demodulator supplied with a reception signal received from said transmitter for carrying out orthogonal demodulation by the use of a local signal to convert said reception signal into an analog baseband signal;

an A/D converter supplied with said analog baseband signal produced by said orthogonal demodulator for carrying out A/D conversion to produce a digital baseband signal;

a delay profile/search circuit responsive to said digital baseband signal produced by said A/D converter for producing profile data represents profile of data of the digital baseband signal and a frame timing correction amount, said profile data representing a profile of data including in the digital baseband signal, said delay profile/search circuit being furthermore for calculating, with reference to said frame timing correction amount, a frequency error representative of a difference in frequency between the reference clock signal in said receiver and the reference clock signal in said transmitter and for judging that an AFC operation is put into an unlocked state to produce an unlock signal if an absolute value of said frequency error becomes equal to or greater than a predetermined value, said delay profile/search circuit judging that the AFC operation is put into a locked state to produce a lock signal if said frequency error becomes smaller than said predetermined value;

a timing generating circuit for generating an ideal frame timing on the basis of the reference clock signal in said receiver and for adding said frame timing correction amount to said ideal frame timing to produce a frame timing signal for use in demodulating said digital baseband signal;

a logical table memorizing section which memorizes a table of the frequency error based on said frame timing correction amount and which is supplied with a particular frame timing correction amount calculated by said delay profile/search circuit for calculating a particular frequency error corresponding to said particular frame timing correction amount supplied thereto;

an accumulator which produces a control voltage and which is for adding to a current value of the control voltage the frequency error calculated by said logical table memorizing section to produce a new value of the control voltage;

a reference clock generating circuit for generating, as the reference clock signal in said receiver, a controlled reference clock signal having an oscillation frequency controlled by said new value of the control voltage; and a PLL circuit for producing said local signal on the basis of said controlled reference clock signal.

* * * * *